United States Patent
Yang et al.

(10) Patent No.: US 7,973,587 B2
(45) Date of Patent: Jul. 5, 2011

(54) TRANSCONDUCTOR HAVING HIGH LINEARITY AND PROGRAMMABLE GAIN AND MIXER USING THE SAME

(75) Inventors: Chao-Tung Yang, Tainan (TW); Shuo Yuan Hsiao, Hsinchu (TW); Fucheng Wang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 186 days.

(21) Appl. No.: 12/211,277

(22) Filed: Sep. 16, 2008

(65) Prior Publication Data

US 2009/0085663 A1     Apr. 2, 2009

Related U.S. Application Data

(60) Provisional application No. 60/975,519, filed on Sep. 27, 2007.

(51) Int. Cl.
*G06F 7/44* (2006.01)
(52) U.S. Cl. .......... 327/359; 327/63; 327/560; 330/252; 455/333
(58) Field of Classification Search .............. 327/63, 327/65–67, 560, 563, 355–363; 330/252, 330/259, 254, 260; 455/326, 333, 325, 323
See application file for complete search history.

(56) References Cited

U.S. PATENT DOCUMENTS

2007/0200622 A1 * 8/2007 Filoramo et al. ............. 330/10

OTHER PUBLICATIONS

Chinese Patent Office, Office Action dated Mar. 10, 2010 (17 pages).
Brenna, G. et al, "A 2-GHz Carrier leakage Calibrated Direct-conversion WCDMA Transmitter in 0.13-µm CMOS," IEEE Journal of Solid-State Circuits, vol. 39, No. 8, Aug. 2004, pp. 1253-1262.
Vassiliou, I. et al., A Single-Chip digitally Calibrated 5.15-5.825-GHz 0.18-µm CMOS transceiver for 802.11a Wireless LAN, IEEE Journal of Solid-State Circuits, vol. 38, No. 12, Dec. 2003, pp. 2221-2231.
Simon, Martin et al., "An 802.11a/b/g RF Transceiver in an SoC," 2007 IEEE International Solid-State Circuits Conference Digest of Technical Papers, Feb. 14, 2007, ISSCC 2007 Session 31/WLAN/Bluetooth/31.3, pp. 562-564.
Song, E. et al., "A 0.25-µm CMOS Quad-Band GSM RF Transceiver Using an Efficient LO Frequency Plan," IEEE Journal of Solid-State Circuits, vol. 40, No. 5, May 2005, pp. 1094-1106.

* cited by examiner

*Primary Examiner* — Lincoln Donovan
*Assistant Examiner* — Shikha Goyal
(74) *Attorney, Agent, or Firm* — Edell, Shapiro & Finnan, LLC

(57) ABSTRACT

A mixer having high linearity and an associated transconductor combining programmable gain amplifier and mixer functions are provided. The transconductor includes first and second resistors, a differential amplifier, first and second feedback circuits, and first and second transistors. A differential voltage signal is inputted to first and second input ends of the differential amplifier via the first and second resistors. The first and second feedback circuits are provided between a first output end and the first input end, and a second output end and the second input end of the differential amplifier, respectively. The first output end outputs a first output signal for controlling a first current passing through the first transistor. The second output end outputs a second output signal for controlling a second current passing through the second transistor. The first current and the second current determine a differential current.

16 Claims, 10 Drawing Sheets

TRANSCONDUCTOR HAVING HIGH LINEARITY AND PROGRAMMABLE GAIN AND MIXER USING THE SAME

This application claims the benefit of U.S. Provisional Application No. 60/975,519 filed Sep. 27, 2007, which is herein incorporated by reference in its entirety.

FIELD OF THE INVENTION

The present invention relates to a transconductor used in a mixer, and more particularly, to a mixer having high linearity and programmable gain.

BACKGROUND OF THE INVENTION

A mixer is commonly used as a frequency converting component in a wireless transceiver. FIG. 1 shows a conventional wireless transceiver 10. The wireless transceiver 10 comprises filters 11 and 12, programmable gain amplifiers 13 and 14, mixers 15 and 16, and a power amplifier 17. Given a baseband input signal I, for example, the baseband input signal I is filtered by the filter 11 to remove unwanted frequency components, amplified or attenuated using the programmable gain amplifier 13, and transmitted into the mixer 15. The baseband input signal I is then converted to a radio frequency specified by standards according to an oscillation signal $LO_I$ generated by a local oscillator (not shown). Finally, the converted signal is amplified by the power amplifier 17 so as to proceed with wireless transmission. In the wireless transceiver 10, frequency conversion performed by the mixers 15 and 16 plays a crucial role in determining signal quality of the wireless transmission.

FIG. 2 shows a circuit diagram of a conventional mixer. A Gilbert mixer 20 comprises a transconductor 21, a switch quad 22 and a load circuit 23. The load circuit 23 includes loads 231 and 232. The loads 231 and 232 each has one end thereof coupled to a voltage supply Vcc, and the other end thereof being an output end. The switch quad 22 comprises NMOS transistors M3, M4, M5 and M6. The drains of M3 and M5 are coupled to one end of the load 231. The drains of M4 and M6 are coupled to one end of the load 232. In addition, the gates of M3 and M6 are coupled to each other, and the gates of M4 and M5 are coupled to each other. The gates of M3 and M4 may receive a local oscillator signal LO. The sources of M3 and M4 are coupled to form a first current path. The sources of M5 and M6 are coupled to form a second current path.

The transconductor 21 comprises NMOS transistors M1 and M2. The drain of M1 is coupled to the first current path of the switch quad 22. The drain of M2 is coupled to the second current path of the switch quad 22. The gates of M1 and M2 receive voltage signals $Vin^+$ and $Vin^-$, respectively. The sources of M1 and M2 are coupled to each other. Between the source of M1 and a ground terminal is an NMOS transistor MS. The gate of transistor MS is inputted with a constant voltage to facilitate the transistor MS in forming a current source.

FIG. 3 shows a schematic diagram of signals associated with the mixer 20. The transconductor 21 converts a differential input voltage signal Vin, that is, $Vin^+$ or $Vin^-$, to a current signal Ib. When passing through the first current path and the second current path of the switch quad 22, the current signal Ib is driven by the oscillator signal LO to generate a frequency-converted current signal. The frequency-converted current signal is next converted by the load circuit 23 to generate an output voltage at the output end.

The transconductor 21 consists of the NMOS transistors M1 and M2, and therefore a voltage-current relationship of the transconductor 21 is a conic relationship rather than a linear relationship. To be more specific, the prior art mixer shown in FIG. 2 is unsuitable for applications on mixers that are in need of high linearity, such as in Wireless Local Access Network (WLAN) transmitters and Code Division Multiple Access (CDMA) system transmitters.

SUMMARY OF THE INVENTION

In view of the foregoing reasons, an object of the invention is to provide a mixer having high linearity and an associated transconductor, which minimize the non-linearity issue occurring in a transconductor of a conventional mixer.

Another object of the invention is to provide a mixer having high linearity and a programmable gain, and an associated transconductor, which together provide functions of a programmable gain amplifier and a mixer to reduce power consumption as well as die size.

A mixer according to the invention comprises a load circuit, a switch quad, and a transconductor. The switch quad is coupled to the load circuit, and comprises a first current path and a second current path. A node where the switch quad is coupled to the load circuit is an output end of the mixer. The transconductor comprises a first resistor and a second resistor; a differential amplifier comprising a first input end, a second input end, a first output end, and a second output end, wherein a differential voltage signal is inputted to the first input end and the second input end via the first resistor and the second resistor, respectively; a first feedback circuit, provided between the first output end and the first input end; a second feedback circuit, provided between the second output end and the second input end; a first transistor, having the drain thereof coupled to the first current path and the gate thereof coupled to the first output end of the differential amplifier, wherein the first output end outputs a first output signal for controlling a first current passing through the first transistor; and a second transistor, having the drain thereof coupled to the second current path and the gate thereof coupled to the second output end of the differential amplifier, wherein the second output end outputs a second output signal for controlling a second current passing through the second resistor. The first current and the second current determine a differential current.

A transconductor according to the invention for use in a mixer comprises a first resistor and a second resistor; a differential amplifier comprising a first input end, a second input end, a first output end, and a second output end, wherein a differential voltage signal is inputted to the first input end and the second input end via the first resistor and the second resistor, respectively; a first feedback circuit, provided between the first output end and the first input end; a second feedback circuit, provided between the second output end and the second input end; a first transistor, having the drain thereof coupled to the first current path and the gate thereof coupled to the first output end of the differential amplifier, wherein the first output end outputs a first output signal for controlling a first current passing through the first transistor; and a second transistor, having the drain thereof coupled to the second current path and the gate thereof coupled to the second output end of the differential amplifier, wherein the second output end outputs a second output signal for controlling a second current passing through the second resistor. The first current and the second current determine a differential current.

According to one embodiment of the invention, the first feedback circuit of the transconductor comprises a third transistor, which has the gate thereof coupled to the first output end of the differential amplifier and forms a first current mirror with the first transistor; and the second feedback circuit comprises a fourth transistor, which has the gate thereof coupled to the second output end of the differential amplifier and forms a second current mirror with the second transistor.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
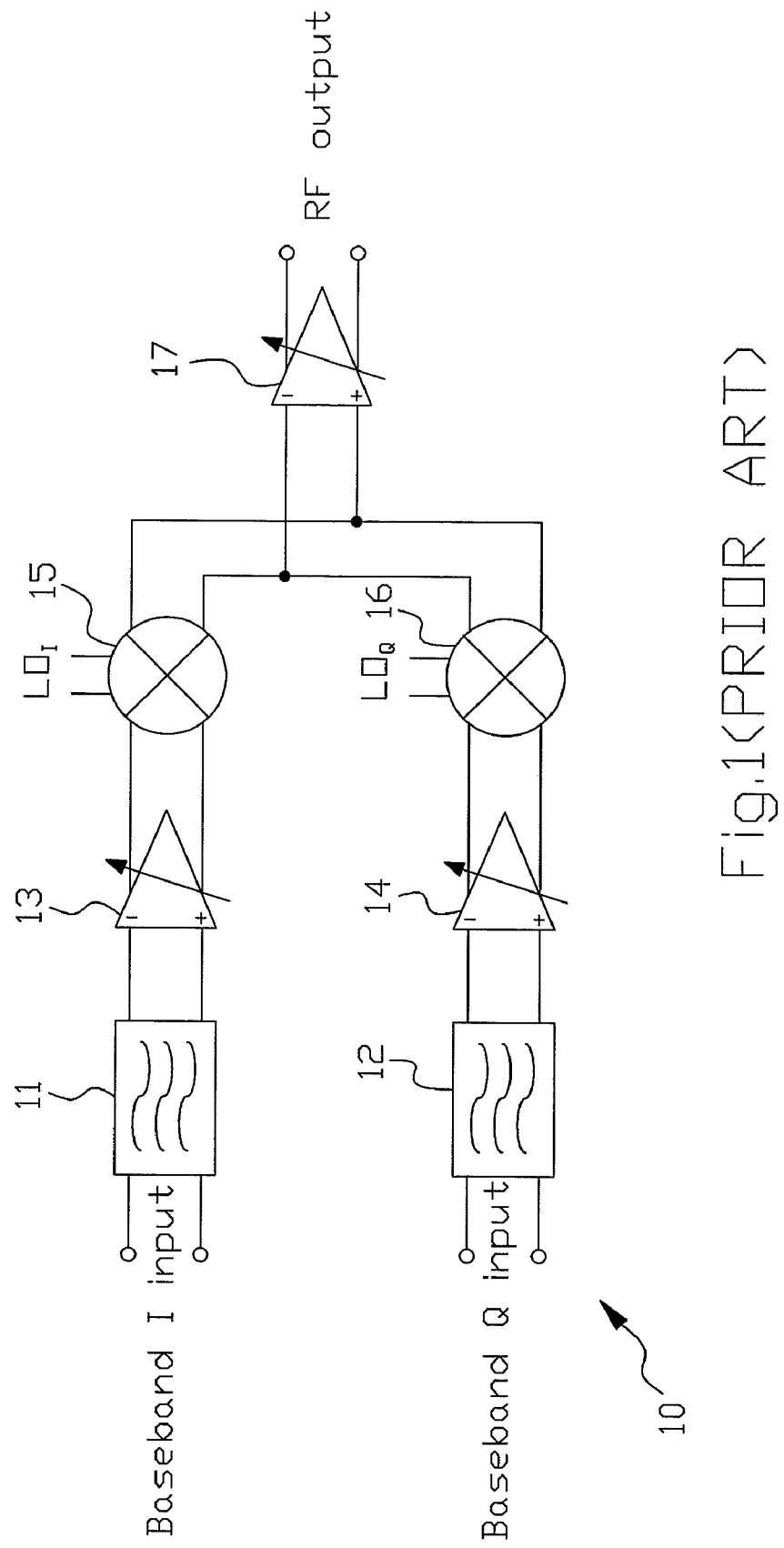
FIG. 1 is a schematic diagram of a conventional wireless transmitter.
Figure 2:
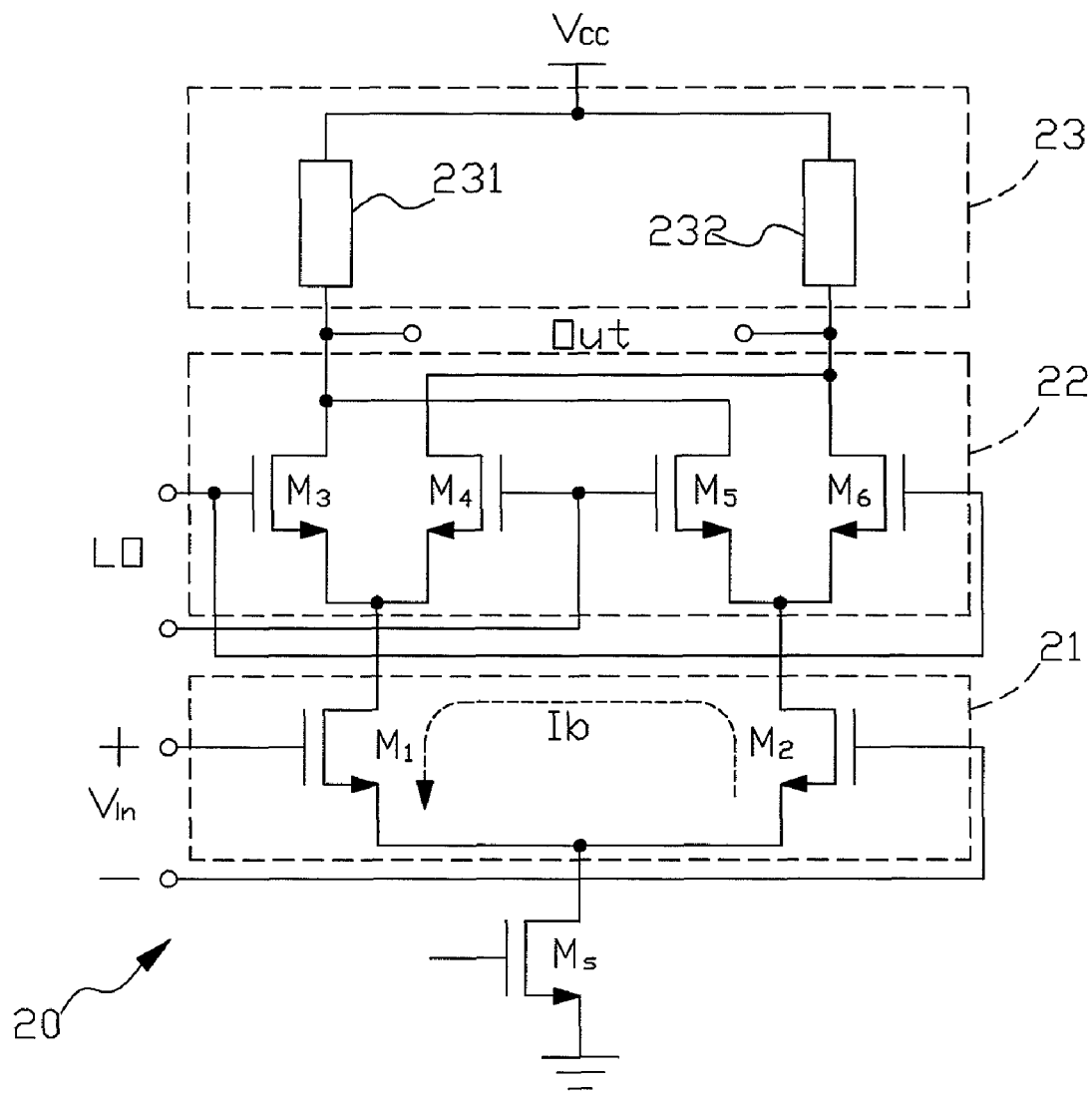
FIG. 2 is a circuit diagram of a conventional mixer.
Figure 3:
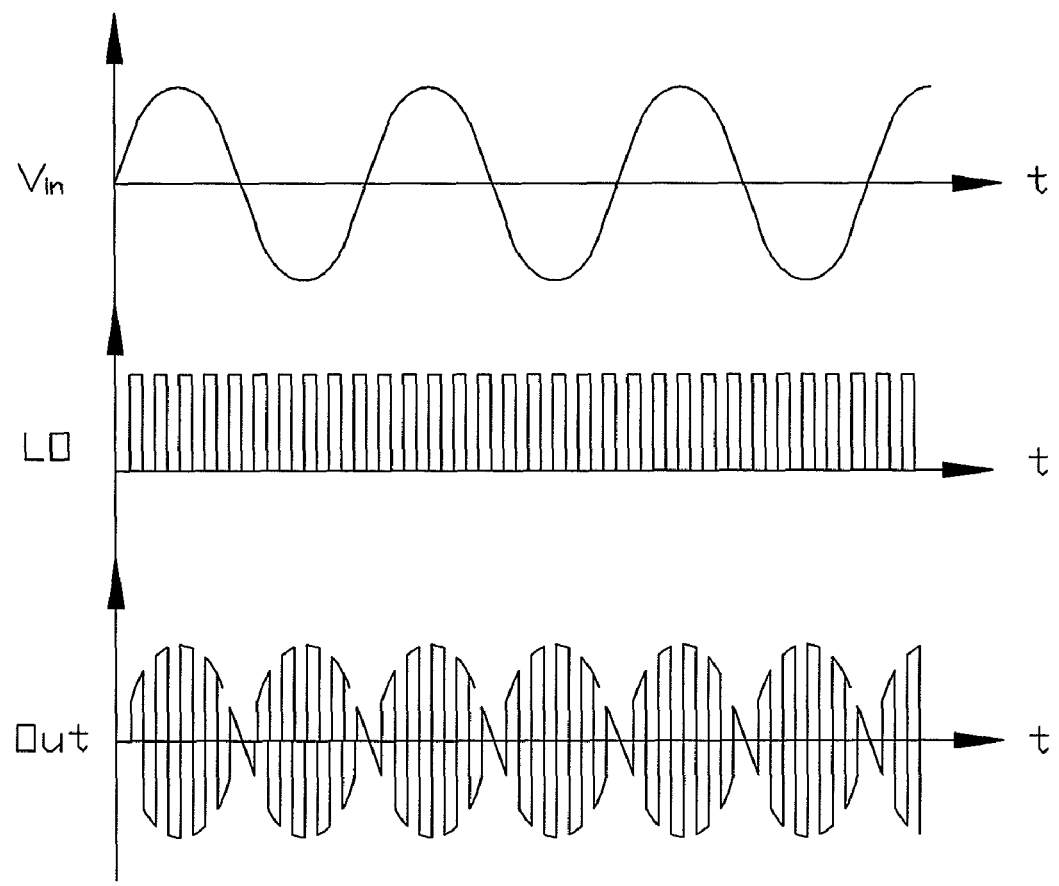
FIG. 3 shows a schematic diagram of signals associated with a conventional mixer.
Figure 4:
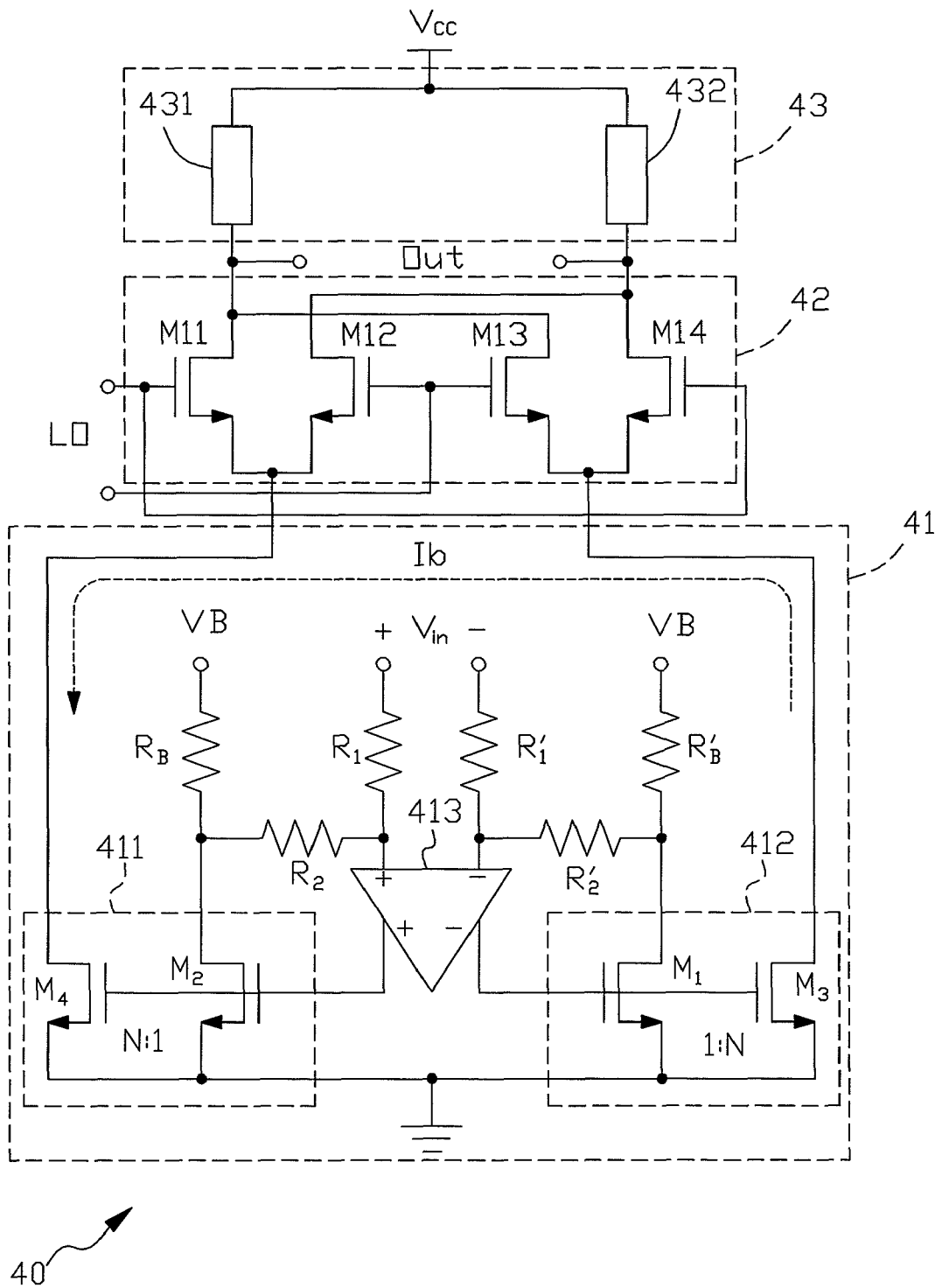
FIG. 4 shows a circuit diagram of a mixer according to a first embodiment of the invention.

FIG. 4 shows a circuit diagram of a mixer according to a first embodiment of the invention. A mixer 40 comprises a transconductor 41, a switch quad 42 and a load circuit 43. The load circuit 43 comprises the loads 431 and 432. Each of the loads 431 and 432 has one end thereof coupled to a voltage supply Vcc, and the other end thereof being an output end. In the switch quad 42, the sources of transistors M11 and M12 are coupled to form a first current path. The sources of transistors M13 and M14 are coupled to form a second current path.

The transconductor 41 comprises resistors R1, R2, RB, R1', R2' and RB', a differential amplifier 413, and current mirrors 411 and 412. The current mirror 411 comprises NMOS transistors M2 and M4. The transistors M2 and M4 have the drains thereof coupled to each other, and sources thereof coupled to ground. The drain of the transistor M2 is a control current end of the current mirror 411. The drain of the transistor M4 is a mirror current end of the current mirror 411. A length-width ratio of M2 and M4 is 1:N, where N is a positive number. In terms of operation, the gate of the transistor M2 serves as an input end of the current mirror 411 to receive a control signal, which is an output signal from the positive output end of the amplifier 413. Accordingly, a corresponding control current is generated at the control current end, which is the drain of the transistor M2; whereas a mirror current is generated at the mirror current end, which is the drain of the transistor M4. Amplitude of the mirror current is N-fold of the control current.

Symmetrically, the current mirror 412 comprises NMOS transistors M1 and M3. The transistors M1 and M3 have the drains thereof coupled to each other, and sources thereof coupled to ground. The drain of the transistor M1 is a control current end of the current mirror 412. The drain of the transistor M3 is a mirror current end of the current mirror 412. A length-width ratio of the transistors M1 and M3 is 1:N, where N is a positive number. In terms of operation, the gate of the transistor M1 serves as an input end of the current mirror 411 to receive a control signal, which is an output signal from the negative output end of the amplifier 413. Accordingly, a corresponding control current is generated at the control current end, which is the drain of the transistor M1; whereas a mirror current is generated at the mirror current end, which is the drain of the transistor M3. Amplitude of the mirror current is N-fold of the control current.

The resistors R1 and R1' have one end thereof coupled to the positive input end and the negative input end of the differential amplifier 413, respectively, and the other end thereof for receiving an input differential voltage signal Vin. The resistor R2 is coupled between the positive end of the differential amplifier 413 and the drain of the transistor M2. The resistor R2' is coupled between the negative end of the differential amplifier 413 and the drain of the transistor M1. The resistor RB is coupled between the drain of the transistor M2 and a voltage supply VB. The resistor RB' is coupled between the drain of the transistor M1 and the voltage supply VB. The gates of the transistors M2 and M1 are coupled to the positive output end and the negative output end of the differential amplifier 413, respectively. The drains of the transistors M4 and M3 are coupled to the first current path and the second current path of the switch quad 42, respectively. Using control signals outputted from the positive output end and the negative output end of the differential amplifier 413, the gates of the transistors M4 and M3 are controlled, respectively, so as to form a differential current by the currents passing through the transistors M4 and M3. In the transconductor 41, a first feedback circuit is formed between the positive output end and the positive input end of the differential amplifier 413. The first feedback circuit includes the transistor M2, and the resistors RB and R2. A second feedback circuit is formed between the negative output end and the negative input end of the differential amplifier 413. The second feedback circuit includes the transistor M1, and the resistors RB' and R2'. Both the first and second feedback circuits provide negative feedback to assist the transconductor 41 in providing linear transconductance, as to be described below. For the reason that the mixer 40 is a fully differential circuit, resistor R1=resistor R1', resistor R2=resistor R2', resistor RB=resistor RB', transistor M1=transistor M2, and transistor M3=transistor M4.

Figure 5:
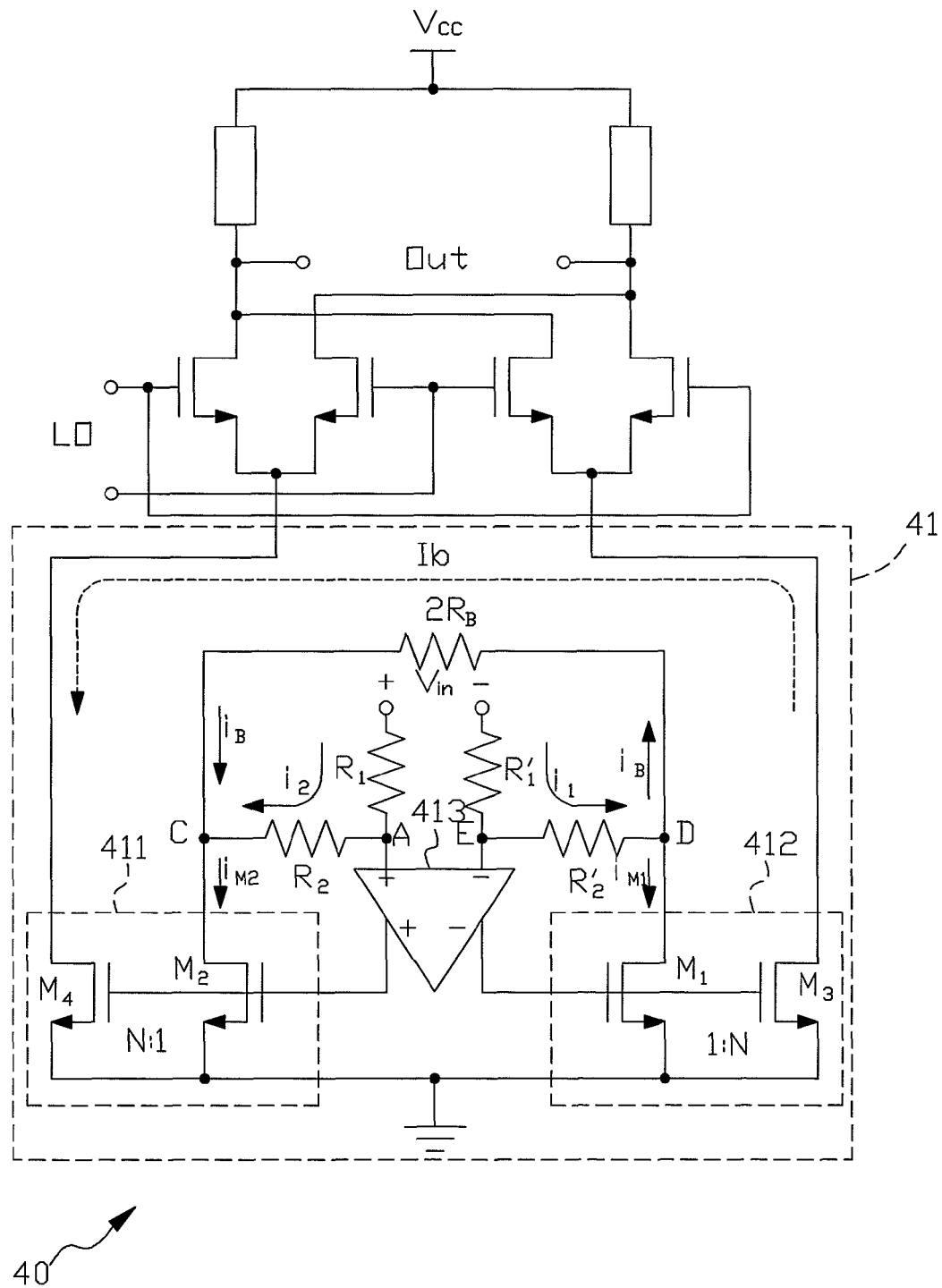
FIG. 5 shows an equivalent circuit diagram of a differential small signal model according to the first embodiment.

FIG. 5 shows an equivalent circuit diagram of a differential small signal model of the first embodiment shown in FIG. 4. The voltage supply VB is regarded as ground, and the resistors RB and RB' are combined as 2RB. The circuit in FIG. 5 is analyzed as follows:

Voltage of point C is:

$$V_C = V_A - i_2 \times R_2 = V_A - \frac{V_{in}^+ - V_A}{R_1} \times R_2$$

Voltage of point D is:

$$V_D = V_E - i_1 \times R_2 = V_E - \frac{V_{in}^- - V_E}{R_1} \times R_2$$

Points A and E are two input ends of the differential amplifier 413, hence a voltage $V_A$ is considered the same as a voltage $V_E$.

Therefore, $$i_B = \frac{V_D - V_C}{2R_B} = \frac{\frac{V_{in}}{R_1} \times R_2}{2R_B} = V_{in} \times \frac{R_2}{2R_1 R_B}$$

In addition, $i_{M2}=i_2+i_B$ and $i_{M1}=i_1-i_B$, hence $$Ib = i_{M4} - i_{M3}$$
$$= N(i_{M2} - i_{M1})$$
$$= N(i_2 - i_1 + 2i_B)$$
$$= N\left(\frac{V_{in}^+ - V_A}{R_1} - \frac{V_{in}^- - V_E}{R_1} + 2V_{in} \times \frac{R_2}{2R_1 R_B}\right)$$
$$= Vin \times N\left(\frac{1}{R_1} + \frac{R_2}{R_1 R_B}\right)$$

As a result, the output current Ib and the input voltage Vin of the transconductor 41 show a linear relationship. To be more explicit, the transconductor 41 has linear transconductance. In addition, provided at least one of the resistors R1, R2 and RB is a variable resistor, the transconductor 41 consequently has a programmable gain $$N\left(\frac{1}{R_1} + \frac{R_2}{R_1 R_B}\right).$$

Therefore, using the transconductor 41, the mixer 40 is provided with high linearity and programmable gain, while being capable of performing functions of a mixer and a programmable gain amplifier to reduce power consumption and die size.

Figure 6:
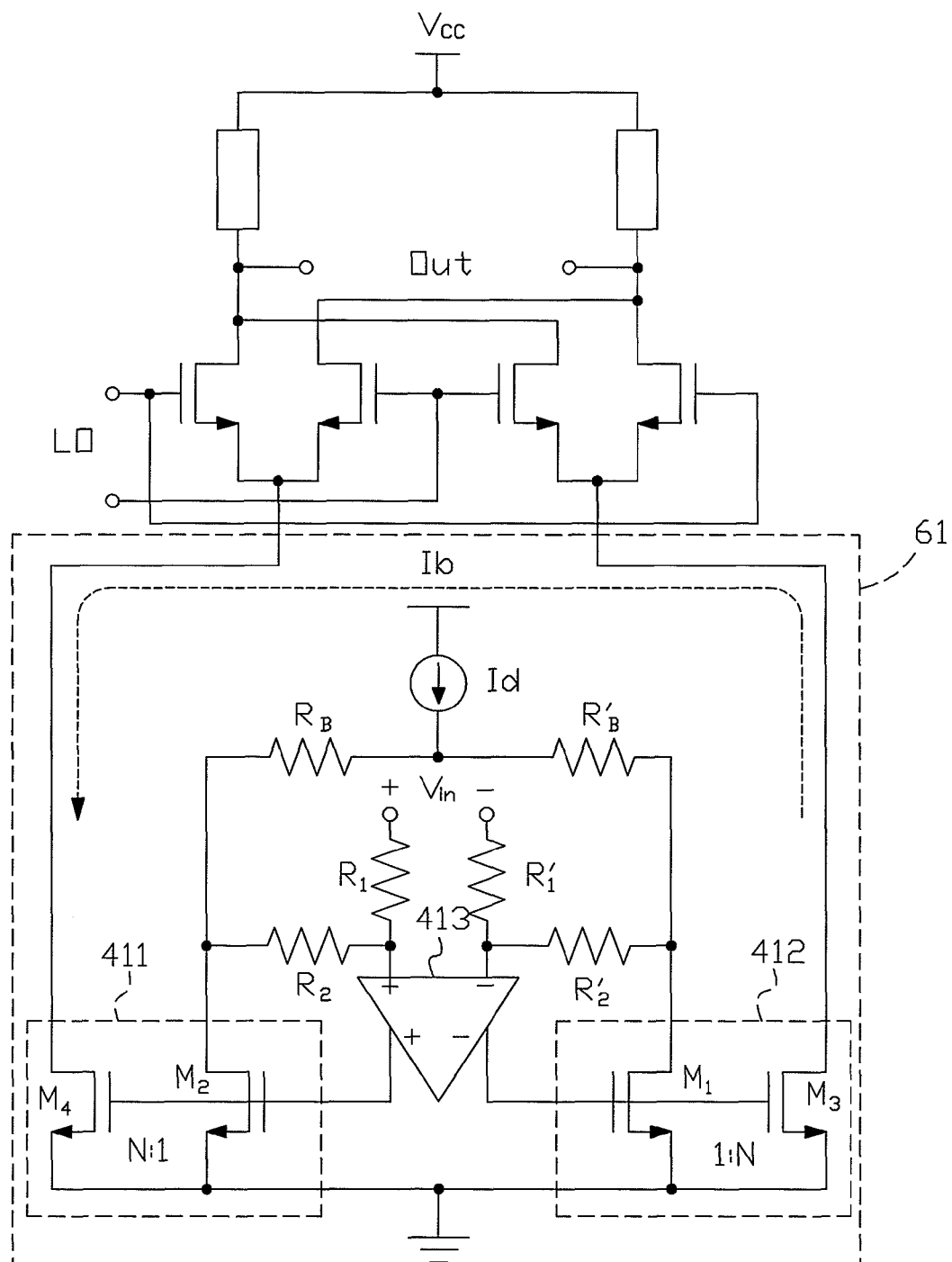
FIG. 6 shows a circuit diagram of a mixer according to a second embodiment of the invention.

FIG. 6 shows a circuit diagram of a mixer according to a second embodiment of the invention. A difference between a mixer 60 in FIG. 6 from the mixer 40 in FIG. 5 is the bias voltage configuration of the resistors RB and RB'. In a transconductor 61, the resistor RB is coupled between the drain of the transistor M2 and a current source Id, and the resistor RB' is coupled between the drain of the transistor M1 and the current source Id. In FIG. 6, if the mixer 60 is converted to an equivalent circuit in a differential small signal model, that is, the current source Id is regarded as a circuit breaker and the resistors RB and RB' are combined to 2RB, the equivalent circuit of the small signal model is the same as that of FIG. 5. As a result, in the second embodiment shown in FIG. 6, the output current Ib and the input voltage Vin of the transconductor 61 have a relationship identical to that of the first embodiment. In other words, the mixer 60 has high linearity and programmable gain.

Figure 7:
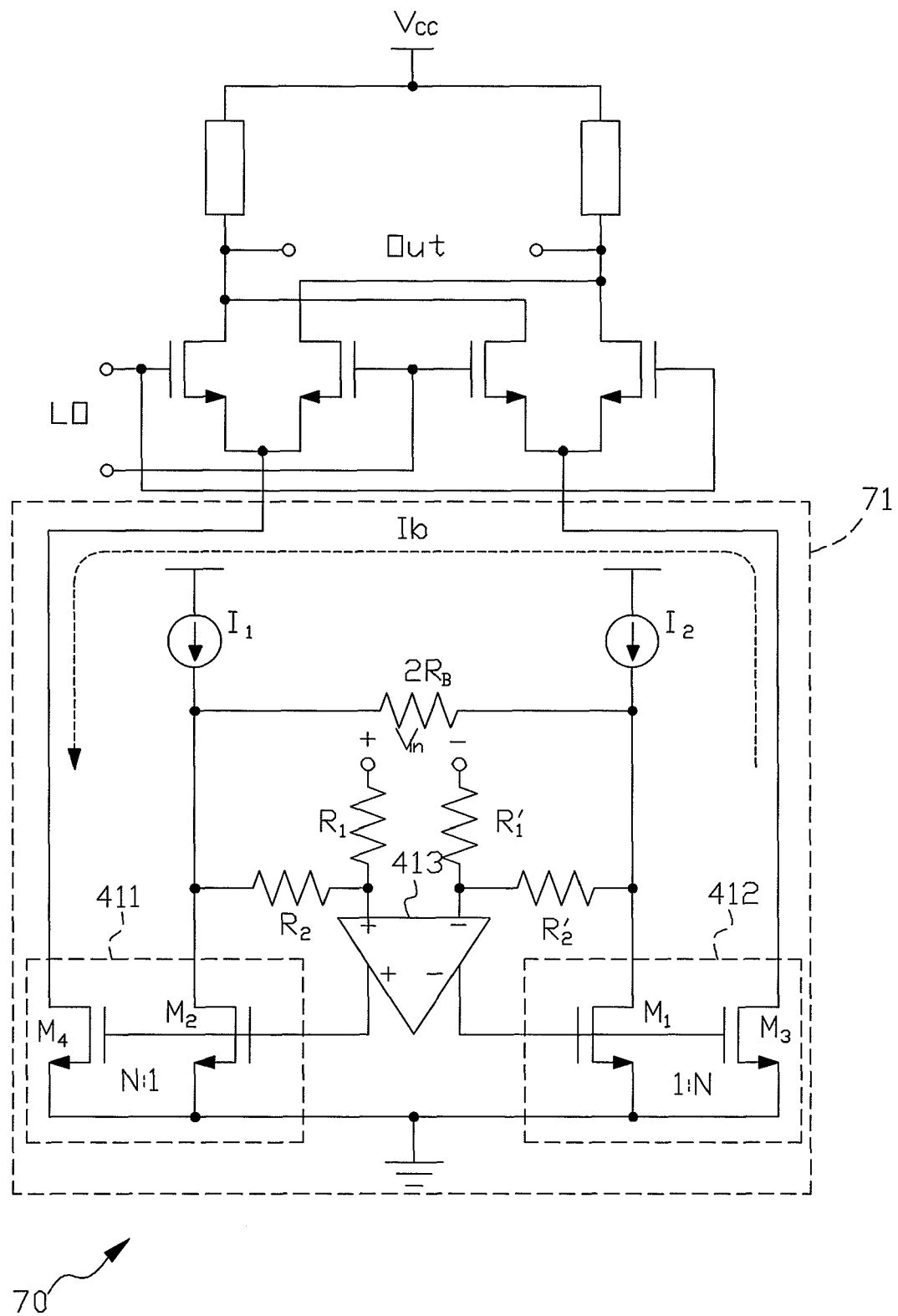
FIG. 7 shows a circuit diagram of a mixer according to a third embodiment of the invention.

FIG. 7 shows a circuit diagram of a mixer according to a third embodiment of the invention. A difference between a mixer 70 in FIG. 7 from the mixer 40 in FIG. 5 is the bias voltage configuration of the resistors RB and RB'. In a transconductor 71, the resistors RB and RB' are combined as a resistor 2RB. The resistor 2RB has one end thereof coupled to a node where the drain of the transistor M2 is coupled to the current source I1, and the other end thereof coupled to a node where the drain of the transistor M1 is coupled to the current source I2. Accordingly, if the mixer 70 in FIG. 7 is converted to an equivalent circuit in a differential small signal model, that is, the current sources I1 and I2 are regarded as circuit breakers, the equivalent circuit of the small signal model is the same as that of FIG. 5. As a result, in the third embodiment shown in FIG. 7, the output current Ib and the input voltage Vin of the transconductor 71 have a relationship identical to that of the first embodiment. In other words, the mixer 70 has high linearity and programmable gain.

Figure 8:
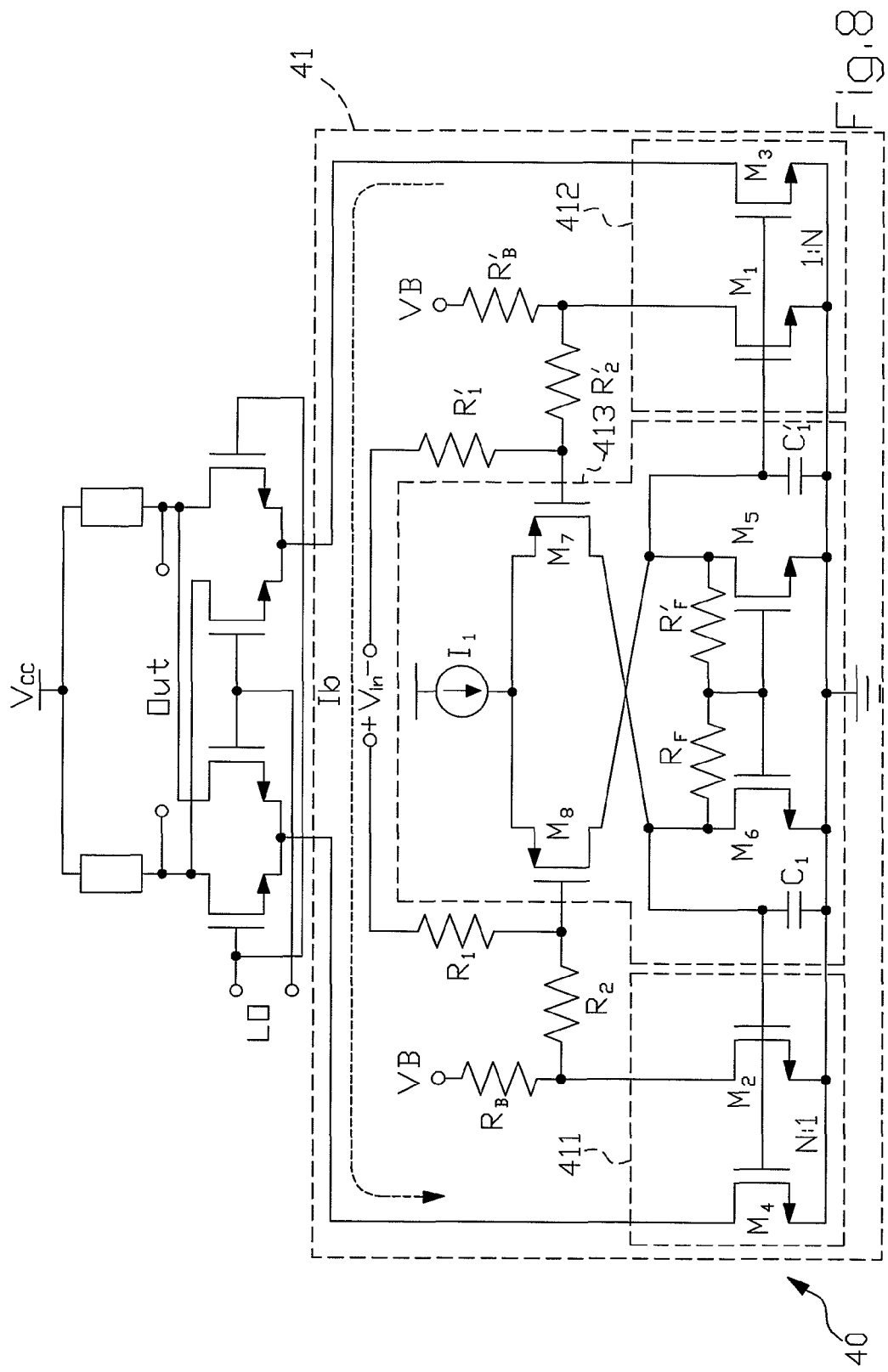
FIG. 8 shows a circuit diagram of a mixer according to a fourth embodiment of the invention.

FIG. 8 shows a circuit diagram of a mixer according to a fourth embodiment of the invention. In FIG. 8, an implementing circuit of the differential amplifier 413 of the mixer 40 in FIG. 4 is shown. The differential amplifier 413 in FIG. 8 comprises a current source I1, NMOS transistors M5 and M6, PMOS transistors M7 and M8, resistors RF and RF', and compensation capacitors C1 and C1'. Transistors M8 and M7 have the sources thereof coupled to the current source I1; the gates thereof being the positive input end and negative input end of the differential amplifier 413, respectively; and the drains thereof being the negative output end and positive output end of the differential amplifier 413, respectively, and coupled to the input end of the current mirror 412 and the input end of the current mirror 411, respectively. The drain of the transistor M8 is coupled to the drain of the transistor M5. The drain of the transistor M7 is coupled to the drain of the transistor M6. The gates of the transistors M6 and M5 are coupled to each other. The sources of the transistors M6 and M5 are both coupled to ground. The resistor RF is coupled between the gate and the drain of the transistor M6. The resistor RF' is coupled between the gate and the drain of the transistor M5. The compensation capacitor C1 is coupled between the drain of the transistor M6 and ground. The compensation capacitor C1' is coupled between the drain of the transistor M5 and ground. Accordingly, the differential amplifier 413 is allowed to function normally. For the reason that the differential amplifier 413 is a fully differential circuit, resistor RF=resistor RF', capacitor C1=capacitor C1', transistor M5=transistor M6, and transistor M7=transistor M8.

In the differential amplifier 413 in FIG. 8, a common-mode voltage is accomplished by large resistors RF and RF'. An advantage of such implementation is that, by using self-bias, circuit operation stability is maintained without additionally connecting to a common-mode feedback circuit, so as to simply an entire circuit and lower hardware cost. Further, large resistors RF and RF' may increase gain of the differential amplifier 413.

Figure 9:
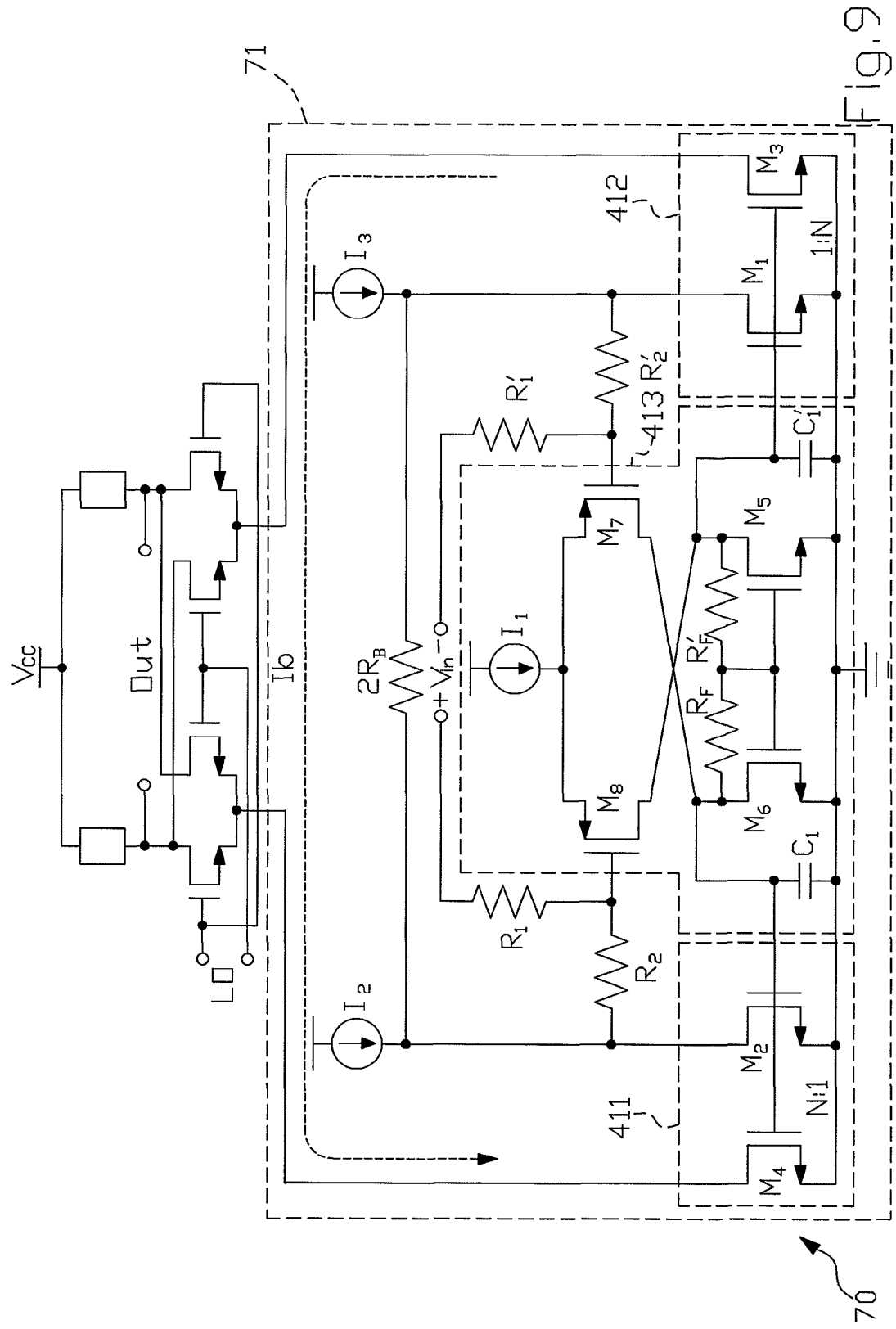
FIG. 9 shows a circuit diagram of a mixer according to a fifth embodiment of the invention.

FIG. 9 shows a circuit diagram of a mixer according to a fifth embodiment of the invention. In FIG. 9, an implementing circuit of the differential amplifier 413 of the mixer 70 in FIG. 7 is shown. In FIG. 9, the implementing circuit of the differential amplifier 413 is identical to that of the amplifier 413 in FIG. 8.

Figure 10:
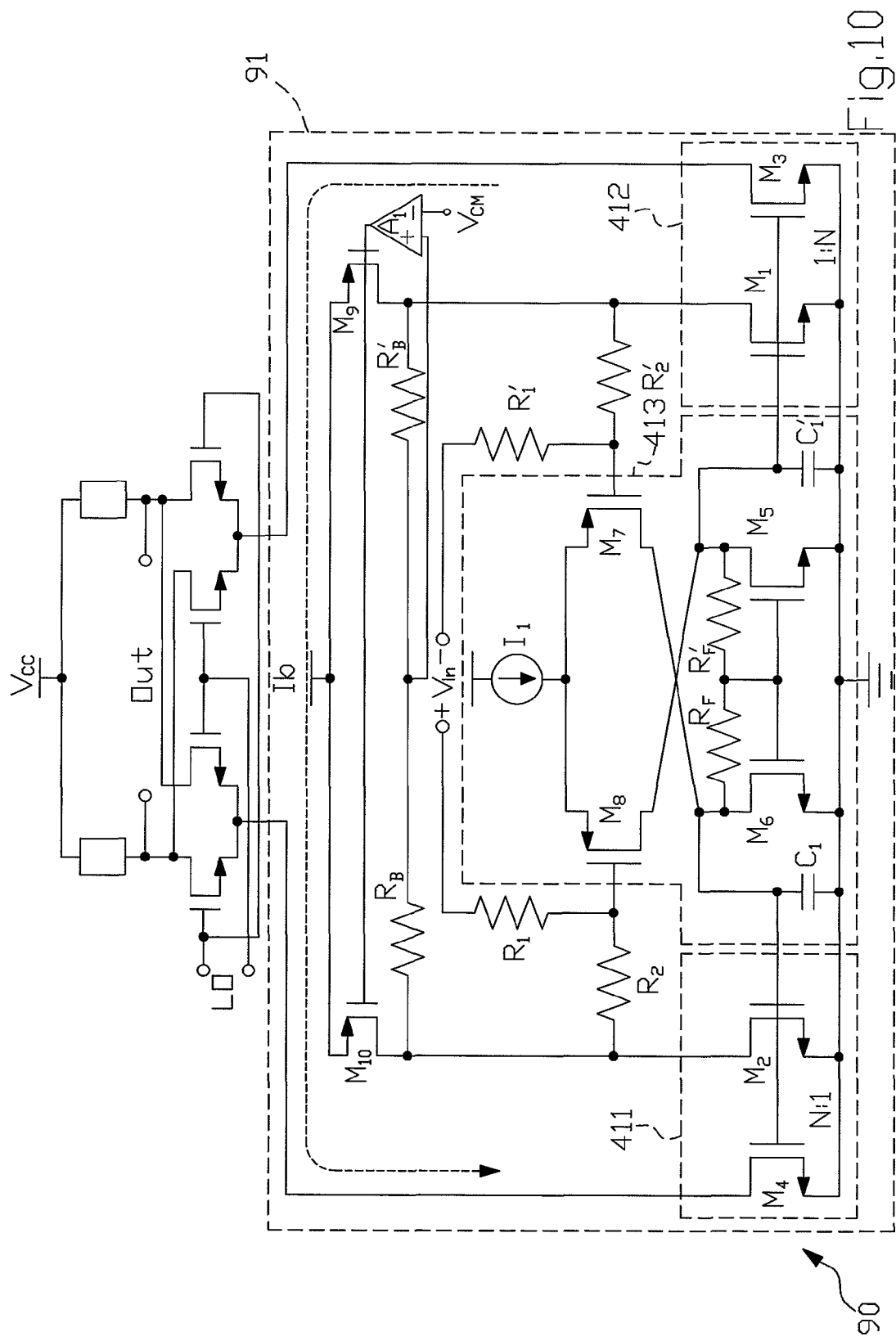
FIG. 10 shows a circuit diagram of a mixer according to a sixth embodiment of the invention.

FIG. 10 shows a circuit diagram of a mixer according to a sixth embodiment of the invention. In FIG. 10, an implementing circuit of the current sources I2 and I3 of the mixer 70 in FIG. 9 is shown. Further, a common-mode feedback circuit is coupled to configure an operating point of a direct current outputted from the transconductor. In a mixer 90 in FIG. 10, a transconductor 91 comprises NMOS transistors M10 and M9 as the current I2 and I3, respectively. An operational amplifier A1 has an output end thereof coupled to the gates of the transistors M10 and M9, the positive end thereof coupled to a coupling point of the resistors RB and RB', and the negative end thereof for inputting a DC common-mode voltage VCM, so as to form a common-mode feedback circuit.

It is to be noted that the transconductor according to the first to sixth embodiments may be implemented in various circuits other than mixers, and therefore the various circuits are regarded as different versions within the invention.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transconductor for use in a mixer, comprising:
   a first resistor, and a second resistor;
   a differential amplifier, comprising a first input end, a second input end, a first output end, and a second output end; wherein, a differential voltage signal is inputted to the first input end and the second input end via the first resistor and the second resistor, respectively;
   a first feedback circuit, provided between the first output end and the first input end;
   a second feedback circuit, provided between the second output end and the second input end;
   a first transistor, having the gate thereof coupled to the first output end of the differential amplifier; wherein the first output end outputs a first output signal for controlling a first current passing through the first transistor; and
   a second transistor, having the gate thereof coupled to the second output end of the differential amplifier; wherein the second output end outputs a second output signal for controlling a second current passing through the second transistor, and the first current and the second current determine a differential current,
   wherein the first feedback circuit comprises a third transistor, which has the gate thereof coupled to the first output end of the differential amplifier and forms a first current mirror with the first transistor; and the second feedback circuit comprises a fourth transistor, which has the gate thereof coupled to the second output end of the differential amplifier and forms a second current mirror with the second transistor,
   wherein the first feedback circuit further comprises a third resistor coupled between the third transistor and the first input end; and the second feedback circuit further comprises a fourth resistor coupled between the fourth transistor and the second input end, and
   wherein the first and second feedback circuits assist the transconductor in providing linear transconductance.

2. The transconductor as claimed in claim 1, wherein a length-width ratio of the first transistor and the third transistor is N:1, and a length-width ratio of the second transistor and the fourth transistor is N:1, with N being a positive number.

3. The transconductor as claimed in claim 1, wherein the first feedback circuit further comprises a fifth resistor, which has one end thereof coupled to a node where the third transistor is coupled to the third resistor, and the other end thereof for receiving a power supply; and the second feedback circuit further comprises a sixth resistor, which has one end thereof coupled to a node where the fourth resistor is coupled to the fourth transistor, and the other end thereof for receiving the power supply.

4. The transconductor as claimed in claim 3, wherein the power supply is a voltage supply.

5. The transconductor as claimed in claim 3, wherein the power supply is a current source.

6. The transconductor as claimed in claim 1, further comprising a first current source, a second current source, and a fifth resistor; wherein, the first current source is inputted to a node where the third transistor is coupled to the third resistor, the second current source is inputted to a node where the fourth transistor is coupled to the fourth resistor, and the fifth resistor is provided between the node where the third transistor is coupled to the third resistor and the node where the fourth transistor is coupled to the fourth resistor.

7. The transconductor as claimed in claim 3, wherein at least one of the first resistor, the third resistor and the fifth resistor is a variable resistor.

8. The transconductor as claimed in claim 1, wherein the first feedback circuit and the second feedback circuit are negative feedback circuits.

9. A mixer, comprising:
   a load circuit;
   a switch quad, coupled to the load circuit, comprising a first current path and a second current path; wherein a node where the switch quad is coupled to the load circuit is an output end of the mixer; and
   a transconductor, comprising:
   a first resistor and a second resistor;
   a differential amplifier, having a first input end, a second input end, a first output end and a second output end; wherein a differential voltage signal is inputted to the first input and the second input end via the first resistor and the second resistor, respectively;
   a first feedback circuit, provided between the first output end and the first input end;
   a second feedback circuit, provided between the second output end and the second input end;
   a first transistor, having the drain thereof coupled to the first current path, and the gate thereof coupled to the first output end of the differential amplifier; wherein the first output end outputs a first output signal for controlling a first current passing through the first transistor; and
   a second transistor, having the drain thereof coupled to the second current path, and the gate thereof coupled to the second output end of the differential amplifier; wherein the second output end outputs a second output signal for controlling a second current passing through the second transistor, and the first current and the second current determine a differential current,
   wherein the first feedback circuit comprises a third transistor, which has the gate thereof coupled to the first output end of the differential amplifier and forms a first current mirror with the first transistor; and the second feedback circuit comprises a fourth transistor, which has the gate thereof coupled to the second output end of the differential amplifier and forms a second current mirror with the second transistor,
   wherein the first feedback circuit further comprises a third resistor coupled between the third transistor and the first input end; and the second feedback circuit further comprises a fourth resistor coupled between the fourth transistor and the second input end, and
   wherein the first and second feedback circuits assist the transconductor in providing linear transconductance.

10. The transconductor as claimed in claim 9, wherein a length-width ratio of the first transistor and the third transistor is N:1, and a length-width ratio of the second transistor and the fourth transistor is N:1, with N being a positive number.

11. The transconductor as claimed in claim 9, wherein the first feedback circuit further comprises a fifth resistor, which has one end thereof coupled to a node where the third transistor is coupled to the third resistor, and the other end thereof for receiving a power supply; and the second feedback circuit further comprises a sixth resistor, which has one end thereof coupled to a node where the fourth resistor is coupled to the fourth transistor, and the other end thereof for receiving the power supply.

12. The transconductor as claimed in claim 11, wherein the power supply is a voltage supply.

13. The transconductor as claimed in claim 11, wherein the power supply is a current source.

14. The transconductor as claimed in claim 9, further comprising a first current source, a second current source, and a fifth resistor; wherein, the first current source is inputted to a node where the third transistor is coupled to the third resistor, the second current source is inputted to a node where the fourth transistor is coupled to the fourth resistor, and the fifth resistor is provided between the node where the third transistor is coupled to the third resistor and the node where the fourth transistor is coupled to the fourth resistor.

15. The transconductor as claimed in claim 11, wherein at least one of the first resistor, the third resistor and the fifth resistor is a variable resistor.

16. The transconductor as claimed in claim 9, wherein the first feedback circuit and the second feedback circuit are negative feedback circuits.

* * * * *